United States Patent
Mielke et al.

(10) Patent No.: US 9,085,879 B2
(45) Date of Patent: Jul. 21, 2015

(54) ELECTRONIC CONTROL SWITCH FOR WATER FAUCETS

(71) Applicant: Grohe AG, Hemer (DE)

(72) Inventors: Achim Mielke, Porta Westfalica (DE); Wulf Woesthoff, Hemer (DE); Guenter Faust, Froendenberg (DE)

(73) Assignee: Grohe AG, Hemer (DE)

( * ) Notice: Subject to any disclaimer, the term of this patent is extended or adjusted under 35 U.S.C. 154(b) by 126 days.

(21) Appl. No.: 13/946,453

(22) Filed: Jul. 19, 2013

(65) Prior Publication Data

US 2014/0026997 A1    Jan. 30, 2014

(30) Foreign Application Priority Data

Jul. 30, 2012   (DE) .................. 10 2012 014 946

(51) Int. Cl.
| | |
|---|---|
| *E03C 1/04* | (2006.01) |
| *F16K 31/08* | (2006.01) |
| *E03C 1/05* | (2006.01) |
| *H03K 17/97* | (2006.01) |

(52) U.S. Cl.
CPC . *E03C 1/04* (2013.01); *E03C 1/055* (2013.01); *F16K 31/08* (2013.01); *H03K 17/97* (2013.01); *H03K 2217/94068* (2013.01); *Y10T 137/9464* (2015.04)

(58) Field of Classification Search
CPC ........... E03C 1/04; E03C 1/055; H03K 17/97; H03K 2217/94068; F16K 31/08; Y10T 137/9464
USPC ........... 137/801; 251/65, 129.03, 129.04, 297
See application file for complete search history.

(56) References Cited

U.S. PATENT DOCUMENTS

| | | | | |
|---|---|---|---|---|
| 4,742,848 | A | * | 5/1988 | Black ............................ 251/297 |
| 5,836,333 | A | * | 11/1998 | Haynes ......................... 251/297 |
| 6,755,195 | B1 | * | 6/2004 | Lemke et al. ................. 128/849 |
| 6,796,544 | B1 | * | 9/2004 | Chen ............................. 137/801 |
| 7,107,631 | B2 | * | 9/2006 | Lang et al. ........................ 4/623 |
| 8,076,603 | B2 | * | 12/2011 | Huang et al. .................. 200/566 |
| 2010/0206409 | A1 | * | 8/2010 | Gautschi et al. .............. 137/614 |
| 2010/0212746 | A1 | * | 8/2010 | Maercovich .................... 251/65 |
| 2010/0327198 | A1 | * | 12/2010 | Lang et al. ............... 251/129.05 |
| 2011/0011473 | A1 | * | 1/2011 | Lang et al. ............... 137/625.41 |
| 2011/0203364 | A1 | * | 8/2011 | Staake et al. .................. 137/801 |

* cited by examiner

*Primary Examiner* — John Bastianelli
(74) *Attorney, Agent, or Firm* — Muncy, Geissler, Olds & Lowe, P.C.

(57) ABSTRACT

An electronic control switch with at least two operating states for water faucets. The control switch has at least one control section, a base section, and a guide for a motion of the two sections relative to one another. At least one sensor is located in one section and at least two magnets are located in the other section, or alternatively at least two sensors are located in one section and at least one magnet is located in the other section, and each magnet associated with an operating state enters a detection region of a sensor at least at times in the course of the relative motion. The magnets at least have different magnetic field strengths or different spacings from the sensor.

15 Claims, 6 Drawing Sheets

ELECTRONIC CONTROL SWITCH FOR WATER FAUCETS

This nonprovisional application claims priority under 35 U.S.C. §119(a) to German Patent Application No. DE 10 2012 014 946.8, which was filed in Germany on Jul. 30, 2012, and which is herein incorporated by reference.

BACKGROUND OF THE INVENTION

1. Field of the Invention

The present invention relates to an electronic control switch with at least two operating states for water faucets.

2. Description of the Background Art

Control switches of this nature are used in connection with devices for water treatment, for example, that make it possible to draw cold water, hot water, and treated water, such as carbonated water. Such devices are marketed under the Grohe Blue® trademark, for example.

It is a disadvantage in conventional control switches that they are operated by means of mechanical elements that can assume various detent positions. Because of the associated increased tolerances in the detent positions, complex calibration of the electronics for the applicable detent positions is required to be able to detect different operating states with a requisite minimum level of reliability. In addition, known systems are subject to increased mechanical wear.

SUMMARY OF THE INVENTION

It is therefore an object of the invention to solve the problems resulting from the conventional art, and in particular to provide a simplified control switch with improved reliability.

In an embodiment an electronic control switch has at least one control section, a base section, and a guide for a motion of the two sections relative to one another, wherein at least one sensor is located in one section and at least two magnets are located in the other section, or alternatively at least two sensors are located in one section and at least one magnet is located in the other section, and each magnet associated with an operating state enters a detection region of a sensor at least at times in the course of the relative motion, wherein the magnets at least have different field strengths or different magnet-sensor spacings are provided. The operating states serve to activate and deactivate different functions of the water faucet. The functions can be, for example, the production and dispensing of cold water, hot water, warm water, or treated water. Treatment of the water can take place through filtration, chilling, and/or the addition of carbon dioxide, known as carbonation. Any type of treatment can be used alone or in combination with the other treatment types. Carbonation, in particular, can be carried out with different states of carbon dioxide enrichment in the water.

With a control switch equipped according to the invention, it is possible to detect, by means of the sensor, discrete and easily distinguishable operating states through the motion of the sections with respect to one another as they carry out the relative motion along a relative motion path defined by the guide. Thus, for example, two magnets with different field strengths can be moved past one sensor at a constant distance. In this case, the sensor either detects no magnetic field, a magnetic field with a first magnetic field strength, or a magnetic field with a second magnetic field strength. In this context, the second magnetic field strength should be understood to mean the maximum of the sensed magnetic field strength during traversal of the relative motion path. Alternatively, it is possible in another embodiment to use a single magnet and to move two sensors along it, wherein the two sensors assume different minimum distances from the magnet employed. This means that the magnet is located at different minimum spacings from the path of motion of the sensors, or the sensors are located at different minimum spacings from the path of motion of the magnet. In this design as well, three operating states can again be sensed. In the first state, the magnet is located outside of a detection region of the sensor, and no magnet and no magnetic field strength are sensed. In the second state the magnet is sensed by the first sensor, and in the third state it is sensed by the second sensor. As a result of the use of magnets of different field strengths, and the use of different spacings between the sensor and magnet either alternatively or in addition, it is possible to sense clearly distinct operating states that can be detected with particular reliability. Moreover, the service life can be significantly improved through the use of permanent magnets and prior art sensors, since they operate in a contactless manner and without wear.

In an embodiment of the present invention, provision is made for the guide to permit a rotary motion of the control section about an axis of rotation of the preferably stationary base section as the relative motion. A rotary motion is generally known in faucets, and is considered ergonomically advantageous.

In addition, it is advantageous for a sensor to be located in a first normal plane and the path of motion of the magnets employed to be located in at least a second, separated normal plane. "Path of motion" in this context can mean that the magnets are guided by the guide along a path of motion that corresponds to the course of the relative motion. In the case of a rotary motion, the path of motion is circular. The identified normal planes in this context lie in the direction perpendicular to the axis of rotation and preferably are parallel to one another in orientation. While it is sufficient for the invention to use a first normal plane and a second normal plane spaced apart therefrom, it is also possible to arrange magnets in additional normal planes at different spacings.

In an embodiment, the magnets can be arranged individually or in groups in the additional second normal planes that have different spacings from the first normal plane. Due to the different spacings, different field strengths that can be sensed can be presented at the sensor. In combination with the use of magnets with different magnetic field strengths, a significantly improved distinguishability of the selected operating states can thus be achieved with a suitable choice of spacings and magnetic field strengths. Naturally, it is important here to ensure that the gain in detectible magnetic field strength when stronger magnets are chosen is not compensated for by a correspondingly increased minimum spacing from the sensor. This interrelationship between the field strength of the selected magnets and the spacings or minimum spacings occurring between magnet and sensor during traversal of the path of motion represents an important feature of the present invention.

In an embodiment, the control switch according to the invention can be integrated into a rotary handle of the water faucet because of the especially favorable actuating situation.

In order to improve the haptic characteristics, moreover, provision can be made for a mechanical detent to releasably catch in at least one actuating position where at least one magnet is located in the detection region of a sensor. This gives the user additional haptic feedback on the reaching of the applicable actuating positions along with the activated function of the faucet.

In addition, the invention provides for an electrically operated water faucet with at least one supply and an electronic controller connected thereto, which is characterized in that it has an electronic control switch according to one of the preceding claims that is connected to the electronic controller. With the electronic control switch according to the invention, a water faucet of this nature can forward detected signals of a selected operating state to an electronic controller that is suitable for processing these signals and controlling the desired functions.

To this end, the electronic controller can have an electronic analysis unit, which is designed such that it can detect maxima and minima of the sensed magnetic field strengths and reliably associate them with the predefined, discrete operating states. If the maxima and minima that are passed through during the motion along the path of motion are counted, this information can additionally be analyzed along with the sensed magnetic field strength in order to ascertain the applicable predetermined operating state even more reliably.

Finally, the electronic controller can include an electronic analysis unit, which analyzes the signals produced by the sensor in order to determine the operating states and can be set to different characteristic curves of the signals. This makes it possible, for example, for manufacturing-related tolerances in the magnetic field strengths measured by the sensor or deviations in the characteristic curve from a reference characteristic curve to be recognized and compensated for, without the need for additional actions. For this purpose, the electronic analysis unit can be programmed with known algorithms in order to obtain appropriate analyses. In addition, the use of magnetic encodings is also possible, so that, for example, an operating state is not detected until after a sequence of a certain magnetic encoding is recognized by number or polarity.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
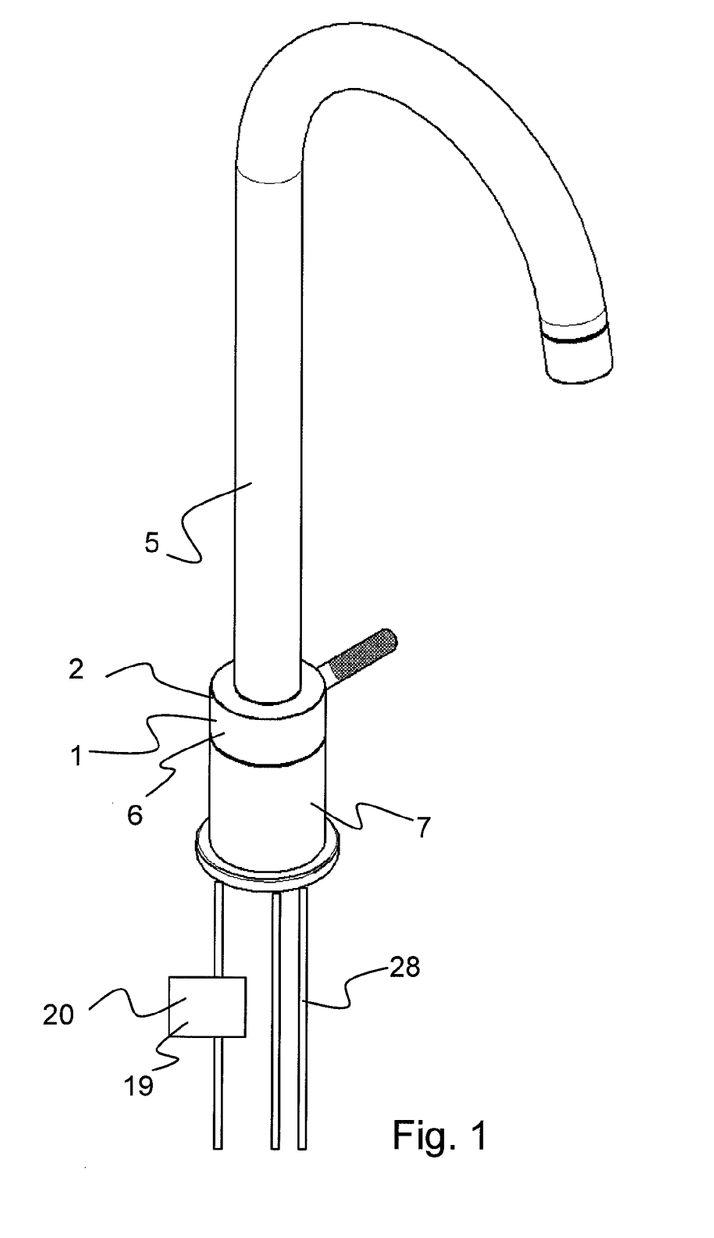
FIG. 1 is a water faucet according to the invention in an oblique view.

FIG. 1 shows a control switch 1 according to the invention in an operating state 2 on a water faucet 5. The control switch 1 has a control section 6, which is supported such that it can rotate relative to a base section 7. The support and guidance of this relative motion is accomplished by internal guide 8.

Figure 2:
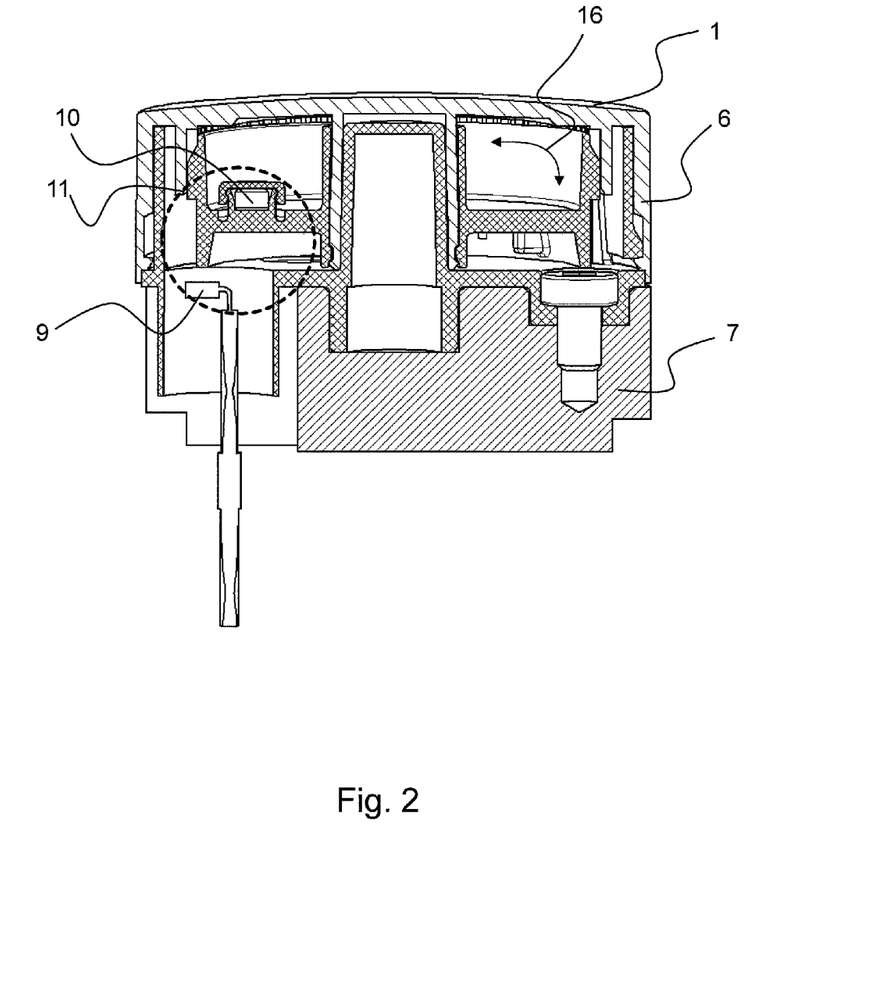
FIG. 2 is a cross-sectional view of a control switch according to the invention.

FIG. 2 shows a cross-sectional view of another embodiment of a control switch 1 according to the invention. The circular control section 6 here is supported such that it can rotate relative to the base section 7, with the guide 8, which are not shown in this figure, permitting a rotary motion about an axis of rotation 13 concentric to the circular control section 6. Shown in the base section 7 is a sensor 9 that senses a magnet 10, which is located in its detection region 11. The magnet 10 is arranged in a recess in the control section 6 that is sealed by a cap, and which thus secures the magnet 10. It is especially advantageous if the contact surface of the magnet is used as a reference surface to produce a defined spacing between magnet 10 and sensor 9. In this way, the magnet 10 can simply be placed in the recess, with it being held in position against the reference surface on the control section 6 by the cap. Alternatively, in an especially simple embodiment the magnets 10 can be brought into contact with the reference surface on the control section 6, and secured in place there by an adhesive. The bottom of a bore in which the magnets 10 are inserted, for example, can serve as a reference surface. Securing in place can then be accomplished by subsequently filling the bore at least partially with a preferably liquid adhesive, which subsequently hardens. This allows for very fast mass production while simultaneously permitting very small manufacturing tolerances. However, other adhesives that are suitable for permanently attaching the magnet 10 to a reference surface can also be used in this context.

Figure 3:
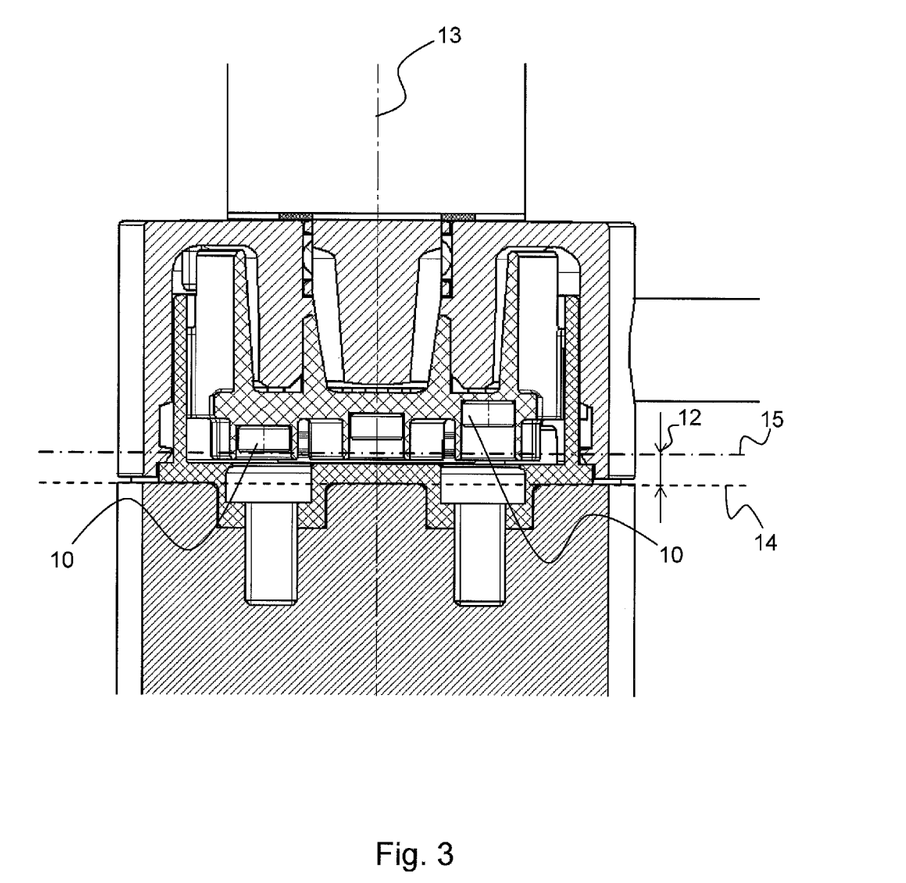
FIG. 3 is a partial sectional view of the water faucet from FIG. 1.

FIG. 3 shows the control switch 1 according to the invention from FIG. 1 in a partial sectional view through the axis of rotation 13. In this embodiment, the sensor 9 (not shown in this cross-sectional representation) is located in a first normal plane 14 and the magnets 10 are located in a second normal plane 15, with the two parallel planes 14, 15 being separated from one another by a spacing 12. The magnets 10 are arranged such that, during the rotary motion about the axis of rotation 13, they move along a circular path of motion and pass through the detection region 11 of the sensor 9. It is also clearly visible in this figure that each of the magnets 10 has a different minimum distance from the first normal plane 14, since they are carried in multiple normal planes 15 that have different planar spacings 12 from the first normal plane 14.

Figure 4:
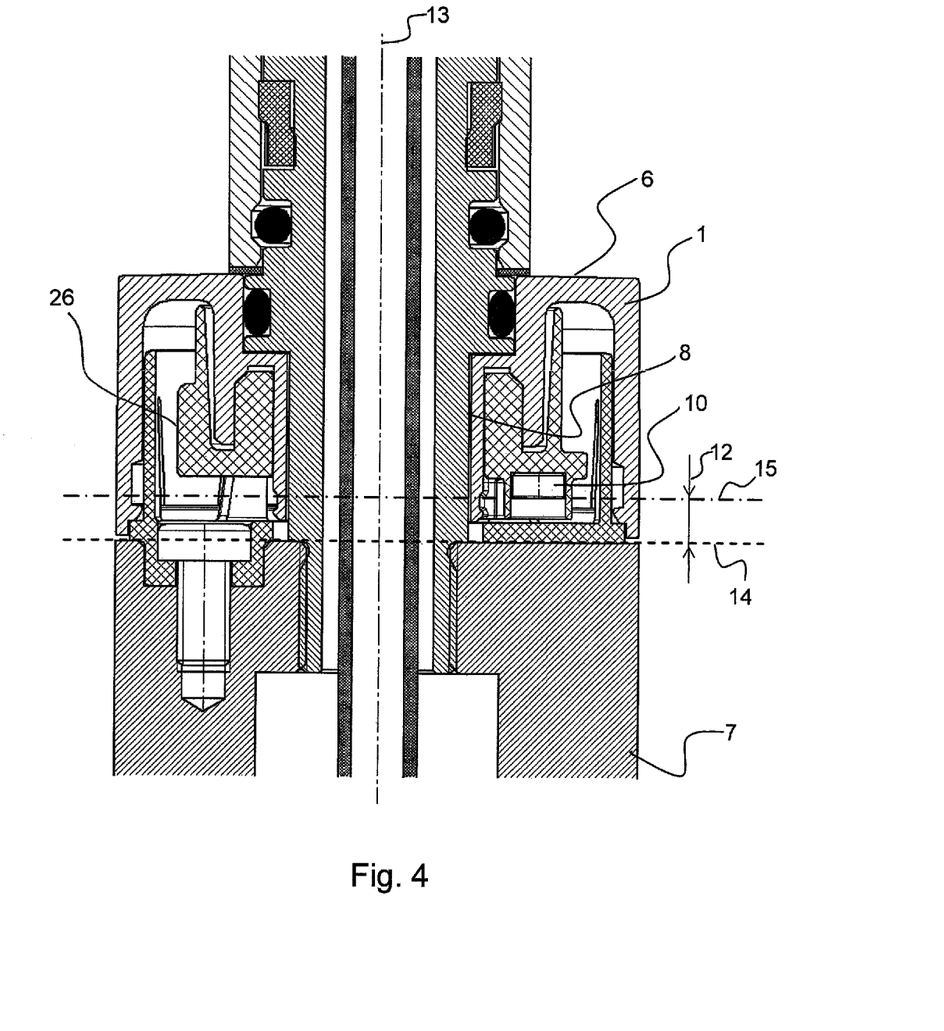
FIG. 4 is another cross-sectional view of the water faucet from FIG. 1.

In FIG. 4, the control switch 1 according to the invention from FIG. 1 is shown again in a different cross-sectional view. The control section 6 is supported by guide 8 such that it can rotate about an axis of rotation 13 relative to the base section 7. In this embodiment, the first normal plane 14 and the second normal plane 15 are separated from one another by a spacing 12. Here, however, provision is made for each magnet 10 employed, and its applicable second normal plane 15, to have a different spacing 12 from the first normal plane 14. As a result of the distinct spacings 12, the differences in the sensed magnetic field strengths, and hence the different operating states, can be detected more reliably. While it is necessary in the example shown in FIG. 3 with constant spacings 12 to use magnets with sufficiently great differences in field strength, which must be large enough that detection by the sensor 9 takes place with the requisite reliability, in the embodiment from FIG. 4 with different spacings 12, it is even possible to use magnets 10 with identical magnetic field strengths. In the simplest case, magnets 10 with identical magnetic field strengths are simply passed in succession at different spacings 12 along the circular path 16 through the detection region 11 of the sensor 9. By this means alone, sufficiently different field strengths are sensed at the sensor 9. This effect can be enhanced even further by the use of magnets 10 with different magnetic field strengths in combination with the different spacings 12. It is only necessary in this solution to ensure that a reduction in the sensed magnetic field strength because of a greater spacing 12, for example, is not compensated for by the use of magnets 10 with greater magnetic field strength, which would mean that reliable detection by the sensor 9 would no longer be possible. Instead, by taking the opposite approach, it is possible, through suitable choice of the spacings 12 and of the magnetic field strengths of the magnets 10, to significantly improve detection by the sensor 9 and the associated distinguishability of the different operating states.

Provision is fundamentally made for each magnet 10 to have an operating state 2 associated with it. However, the use of additional magnets 10 also makes it possible to implement second operating states 3 and third operating states 4 as well as any desired number of additional operating states. As a matter of principle, however, one additional operating state 2, in which no magnet is present in the detection region 11 of the sensor, exists in all embodiments. The number of detectible operating states 2 thus corresponds to the number of magnets 10 employed plus one additional operating state 2.

Figure 5:
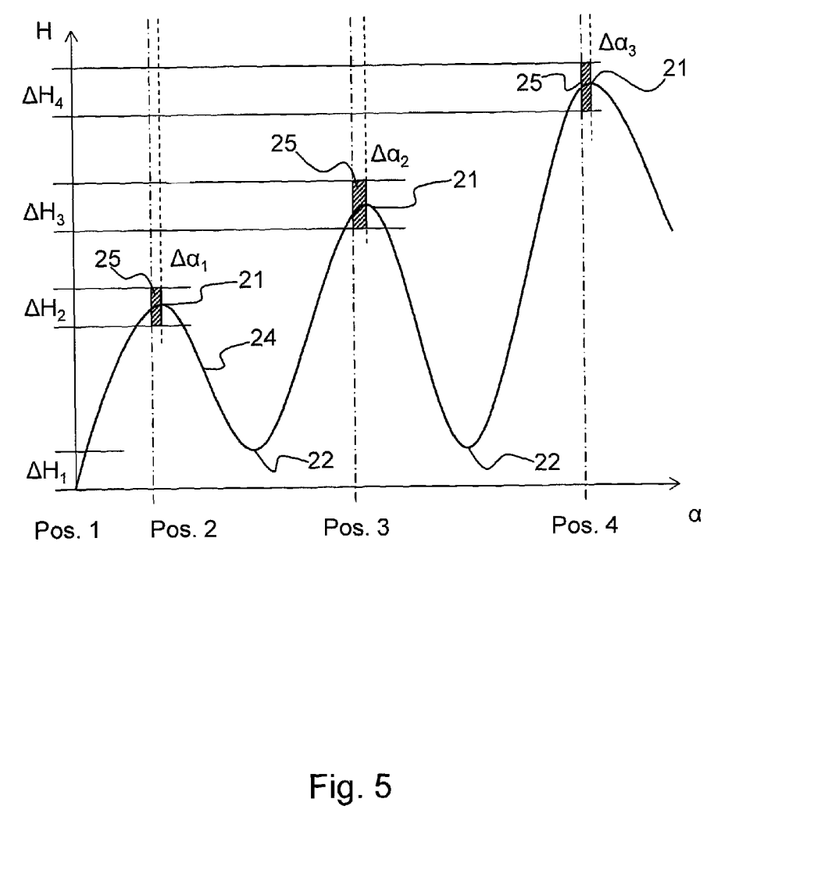
FIG. 5 is a characteristic curve of a sensor signal with four operating states.

In FIG. 5, the magnetic field strength detected by the sensor 9 is graphed against an angle of rotation α of the control section 6. When the control section 6 is in the initial position and no magnet 10 is located in the detection region 11 of the sensor 9, then the position 1 with no magnetic field strength or only a slight magnetic field strength is sensed. This corresponds to the region ΔH1 of the magnetic field strength H. When the control section 6 is rotated, then a first magnet 10 enters the detection region 11 of the sensor 9 and produces a maximum 21 in the region ΔH2. The angular position of the maximum 21 is shown by a vertical, dashed line, which is offset from the theoretical, intended reference position, which is identified by a vertical dashed-and-dotted line. Such an offset Δα arises, for example, as a result of manufacturing tolerances in the mechanical component or else as a result of tolerances in the electronic components used. In the further progress of the characteristic curve 24, a minimum 22 is then detected by the sensor 9 before an additional maximum 21 and an additional minimum 22 are detected. However, the second maximum 21 here has a higher magnetic field strength in the region ΔH3 than the maximum 21 that was previously sensed in the region ΔH2 at the position 2. In this way, an electronic analysis unit 20 that is employed can reliably recognize that a different position, the position 3, has been reached. The same also applies for the illustrated position 4, which has a yet higher maximum 21 with an even higher magnetic field strength in the region ΔH4. The electronic analysis unit 20 is provided in an electronic controller 19 that is connected to a supply 28 (see FIG. 1). The electronic analysis unit 20 can be operated with suitable, known software, which is sufficiently available in the prior art. Parameterization of the software is chosen such that the detection of operating states 2 takes place in an especially reliable and simple way, by the means that signal states within a characteristic curve window 25 are detected with stable tolerances and are associated with the positions 1-4 corresponding to the operating states 2, 3, 4. With the aid of the characteristic curve windows 25, therefore, it is possible to compensate in a reliable manner for tolerances caused by manufacturing and by changes over the lifetime of the control switch 1.

Figure 6:
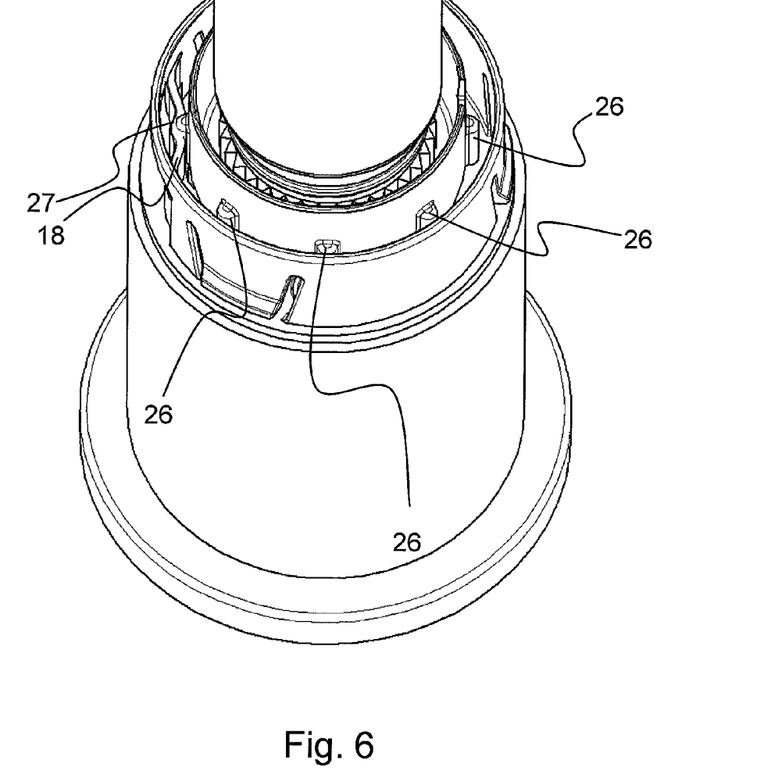
FIG. 6 is a water faucet from FIG. 1 with portions of a control switch not shown.

Finally, in FIG. 6 a detent 18 is shown that provides haptic feedback to a user regarding the different operating states 2, 3, 4 having been reached of the control switch 1. To this end, cams 26 are provided at different positions, each of which corresponds to an operating state. During the course of a rotary motion, the cams 26 pass over the detent 18 and slide into a detent cavity 27, which is elastically resilient and deformable. The resistance that must be applied during the elastic deformation of the detent cavity 27, and also the retention inside the detent cavity 27, give the user a reliable feedback signal regarding the reaching of the specific, discrete operating states 2, 3, 4. It is clearly visible in the depiction in FIG. 6 that the detent cavity 27 deforms radially outward in order to achieve the requisite deformability.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An electronic control switch with at least two operating states for water faucets, the electronic control switch comprising:
   at least one control section;
   a base section;
   a guide for facilitating a relative motion between the at least one control section and the base section;
   at least one sensor arranged in the control section or the base section; and
   at least two magnets arranged in the control section or the base section,
   wherein each magnet is associated with an operating state and enters a detection region of the at least one sensor at least at times in a course of the relative motion,
   wherein the magnets have at least one of different magnetic field strengths or different spacings from the at least one sensor, and
   wherein the at least one sensor and the at least two magnets are arranged in at least two normal planes that extend perpendicular to an axis of rotation of the electronic control switch.

2. The electronic control switch according to claim 1, wherein the guide permits a rotary motion of the control section about the axis of rotation as the relative motion.

3. The electronic control switch according to claim 1, wherein the at least one sensor is located in a first normal plane of the at least two normal planes and the magnets employed are arranged in a circular path in at least one second, separated normal plane of the at least two normal planes.

4. The electronic control switch according to claim 3, wherein the magnets are arranged individually or in groups in additional second normal planes of the at least two normal planes that have different spacings from the first normal plane.

5. The electronic control switch according to claim 1, wherein the at least one sensor comprises at least two sensors and wherein at least one magnet and the at least two sensors are provided with different spacings.

6. The electronic control switch according to claim 1, wherein the at least one sensor comprises at least two sensors and wherein at least one magnet is arranged in a first normal plane of the at least two normal planes and the at least two sensors are arranged in a circular path in at least two second normal planes of the at least two normal planes with different spacings from the first normal plane.

7. The electronic control switch according to claim 1, wherein the control switch is integrated into a rotary handle of the water faucet.

8. The electronic control switch according to claim 1, wherein a mechanical detent is provided in at least one rotary position where at least one magnet is located in the detection region of the at least one sensor.

9. The electronic control switch according to claim 8, further comprising a cam that are retained in a detent cavity of the mechanical detent when the at least one magnet is located in the detection region of the at least one sensor.

10. The electronic control switch according to claim 1, wherein the at least two magnets have different magnetic field strengths and have different spacings from the at least one sensor.

11. An electronic operated water faucet with at least one supply and an electronic controller connected thereto, wherein the electronic operated water faucet has an electronic control switch that is connected to the electronic controller, the electronic control switch comprising:
   at least one control section;
   a base section;
   a guide for facilitating a relative motion between the at least one control section and the base section;
   at least one sensor arranged in the control section or the base section; and
   at least two magnets arranged in the control section or the base section,
   wherein each of the at least two magnets is associated with an operating state and enters a detection region of the at least one sensor at least at times in a course of the relative motion,
   wherein the at least two magnets have at least one of different magnetic field strengths or different spacings from the at least one sensor, and
   wherein the electronic controller includes an electronic analysis unit that is configured to detect a maxima and minima of the magnetic field strengths and associate them with discrete operating states.

12. An electronic operated water faucet with at least one supply and an electronic controller connected thereto, wherein the electronic operated water faucet has an electronic control switch that is connected to the electronic controller, the electronic control switch comprising:
   at least one control section;
   a base section;
   a guide for facilitating a relative motion between the at least one control section and the base section;
   at least one sensor arranged in the control section or the base section; and
   at least two magnets arranged in the control section or the base section,
   wherein each magnet is associated with an operating state and enters a detection region of the at least one sensor at least at times in a course of the relative motion,
   wherein the magnets have at least one of different magnetic field strengths or different spacing from the at least one sensor, and
   wherein the electronic controller includes an electronic analysis unit, which analyzes the magnetic field strengths detected by the at least one sensor in order to ascertain the operating states, and can be set to different characteristic curves using characteristic curve windows.

13. An electronic control switch with at least two operating states for water faucets, the electronic control switch comprising:
   at least one control section;
   a base section;
   a guide for facilitating a relative motion between the at least one control section and the base section;
   at least two sensors arranged in the control section or the base section; and
   at least one magnet arranged in the control section or the base section,
   wherein each of the at least two sensors is associated with an operating state and each of the at least two sensors detects the at least one magnet at times in a course of the relative motion.

14. The electronic control switch according to claim 13, wherein the at least two sensors are arranged in the base section or the control section not occupied by the at least one magnet.

15. The electronic control switch according to claim 13, wherein the at least one magnet and the at least two sensors are arranged in at least two normal planes that extend perpendicular to an axis of rotation of the electronic control switch.

* * * * *